United States Patent
Ogiwara et al.

(10) Patent No.: US 7,609,099 B2
(45) Date of Patent: Oct. 27, 2009

(54) POWER-ON DETECTING CIRCUIT

(75) Inventors: Ryu Ogiwara, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 363 days.

(21) Appl. No.: 11/558,156

(22) Filed: Nov. 9, 2006

(65) Prior Publication Data
US 2007/0115007 A1   May 24, 2007

(30) Foreign Application Priority Data
Nov. 18, 2005   (JP) ............... 2005-334370

(51) Int. Cl.
*H03L 7/00* (2006.01)
(52) U.S. Cl. ................ 327/143; 327/142
(58) Field of Classification Search ......... 327/141–143, 327/530
See application file for complete search history.

(56) References Cited

U.S. PATENT DOCUMENTS

| | | | |
|---|---|---|---|
| 4,100,437 A * | 7/1978 | Hoff, Jr. ............ | 327/543 |
| 5,778,238 A * | 7/1998 | Hofhine ............ | 713/340 |
| 6,320,428 B1 * | 11/2001 | Atsumi et al. ........ | 327/78 |
| 7,102,395 B2 * | 9/2006 | Saito ............... | 327/74 |

FOREIGN PATENT DOCUMENTS

| JP | 2001-127609 | 5/2001 |
|---|---|---|
| JP | 2003-108241 | 4/2003 |
| JP | 2004-71864 | 3/2004 |

* cited by examiner

*Primary Examiner*—Dinh T. Le
(74) *Attorney, Agent, or Firm*—Oblon, Spivak, McClelland, Maier & Neustadt, L.L.P.

(57) ABSTRACT

A circuit for detecting a power-on voltage of power supply encompasses a voltage divider connected between a first power supply and a second power supply, the potential of the second power supply is lower than the potential of the first power supply, and a detecting circuit connected between the first power supply and the second power supply. The voltage divider includes a series circuit encompassing a diode, a first dividing resistor connected to the diode and a second dividing resistor connected between the first dividing resistor and the second power supply. The detecting circuit includes a pMOS transistor whose gate electrode is connected to a connection node between the first dividing resistor and the second dividing resistor, a source resistor connected between the first power supply and the source electrode of the pMOS transistor and a drain resistor connected to the drain electrode of the pMOS transistor and the second power supply.

12 Claims, 6 Drawing Sheets

POWER-ON DETECTING CIRCUIT

CROSS REFERENCE TO RELATED APPLICATION AND INCORPORATION BY REFERENCE

This application is based upon and claims the benefit of priority from prior Japanese Patent Application P2005-334370 filed on Nov. 18, 2005; the entire contents of which are incorporated by reference herein.

BACKGROUND OF THE INVENTION

1. Field of the Invention

The present invention relates to a power-on detection circuit for detecting a state that a supplied voltage has reached to a constant potential, in a period when a power supply is initiated.

2. Description of the Related Art

A circuit for detecting a power-on voltage of power supply (hereinafter called "the power-on detection circuit") has been widely used in a semiconductor device including a memory, for example, as described in Japanese Laid Open Patent Application (JP-P 2001-127609A).

Figure 1:
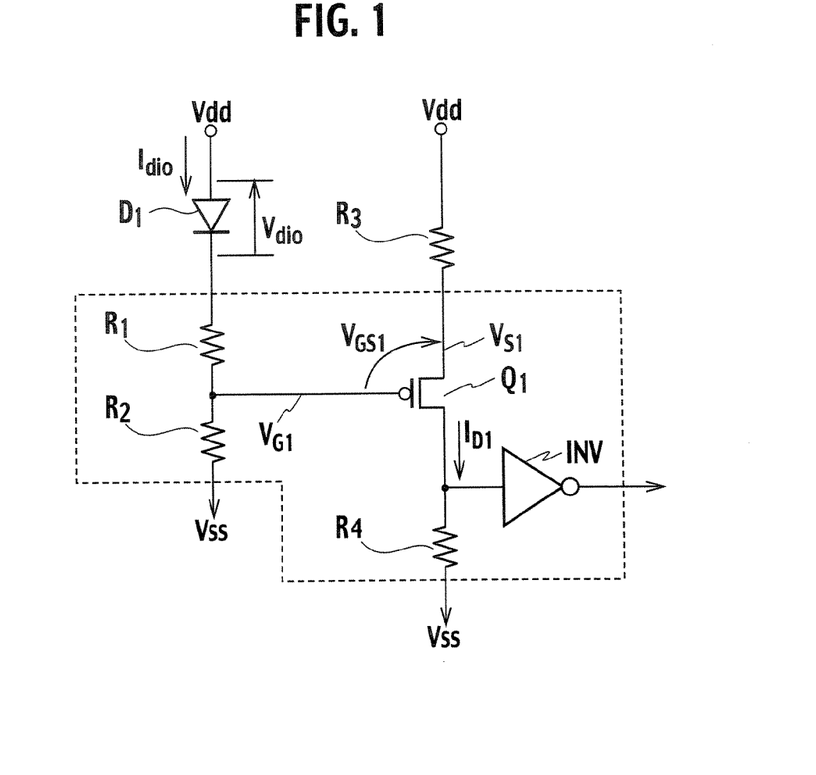
FIG. 1 is a circuit diagram of a power-on detection circuit according to a first embodiment of the present invention.

A conventional power-on detection circuit, which corresponds to a circuit portion surrounded with a box of dashed line in FIG. 1, is known. That is, in the circuit configuration where a series circuit consisting of a first dividing resistor $R_1$ and a second dividing resistor $R_2$ is inserted between a first power supply $V_{dd}$ and a second power supply (ground wiring) $V_{ss}$ of, the second power supply provides a lower potential $V_{ss}$ than the potential $V_{dd}$ of the first power supply, by feeding a current so as to flow through the first dividing resistor $R_1$ and the second dividing resistor $R_2$, a certain desirable potential is obtained from a node between the first dividing resistor $R_1$ and the second dividing resistor $R_2$, by voltage division across the first dividing resistor $R_1$ and the second dividing resistor $R_2$. In order to attain a smaller current which can satisfy a circuit requirement, the resistance values of the first dividing resistor $R_1$ and the second dividing resistor $R_2$ inevitably have the large values determined from the circuit requirement for a semiconductor chip on which a plurality of semiconductor elements are integrated.

Moreover, as shown in the circuit portion surrounded with the box of dashed line of FIG. 1, the node between the first dividing resistor $R_1$ and the second dividing resistor $R_2$ is connected to a gate electrode of a pMOS transistor whose source electrode is connected to the first power supply $V_{dd}$. On the other hand, a drain resistor $R_4$ is inserted between a drain electrode of the pMOS transistor and the second power supply (ground wiring) $V_{ss}$. The potential determined by the voltage division across the first dividing resistor $R_1$ and the second dividing resistor $R_2$ is applied to the gate electrode of the pMOS transistor. Thus, as the potential $V_{dd}$ of the first power supply increases, a potential difference across the source electrode and the gate electrode becomes larger. Then, at a certain potential $V_{dd}$, the pMOS transistor is turned on, thereby detecting the power-on potential.

However, the threshold voltage of the pMOS transistor has temperature dependence. Also, even under a constant temperature, the threshold voltages vary in different semiconductor chips and for different wafers. Thus, there was a problem that, when the power-on was detected, the power-on potential of the first power supply $V_{dd}$ scatters with semiconductor chips and wafers. Moreover, there was a problem that, when a ratio of a resistance value between the first dividing resistor $R_1$ and the second dividing resistor $R_2$ was, for example, 1:2, the variation in the threshold voltage of the pMOS transistor was amplified to three times, which affects the power-on potential.

SUMMARY OF THE INVENTION

An aspect of the present invention inheres in a circuit for detecting a power-on voltage of power supply, encompassing (a) a voltage divider connected between a first power supply and a second power supply, the potential of the second power supply is lower than the potential of the first power supply, and (b) a detecting circuit connected between the first power supply and the second power supply. The voltage divider includes a series circuit encompassing a diode, a first dividing resistor connected to the diode and a second dividing resistor connected between the first dividing resistor and the second power supply. The detecting circuit includes a pMOS transistor whose gate electrode is connected to a connection node between the first dividing resistor and the second dividing resistor, a source resistor connected between the first power supply and the source electrode of the pMOS transistor and a drain resistor connected to the drain electrode of the pMOS transistor and the second power supply.

Another aspect of the present invention inheres in a circuit for detecting a power-on voltage of power supply, encompassing (a) a voltage divider connected between a first power supply and a second power supply, the potential of the second power supply is lower than the potential of the first power supply; and (b) a detecting circuit connected between the first power supply and the second power supply. The voltage divider includes a series circuit encompassing a diode-connected first pMOS transistor, a first dividing resistor connected to the first pMOS transistor and a second dividing resistor connected between the first dividing resistor and the second power supply. The detecting circuit includes a second pMOS transistor whose gate electrode is connected to a connection node between the first dividing resistor and the second dividing resistor, and a drain resistor connected to the drain electrode of the second pMOS transistor and the second power supply.

A still another aspect of the present invention inheres in a circuit for detecting a power-on voltage of power supply, encompassing (a) a voltage divider connected between a first power supply and a second power supply, the potential of the second power supply is lower than the potential of the first power supply; and (b) a detecting circuit connected between the first power supply and the second power supply. The voltage divider includes a series circuit encompassing a diode-connected first divider pMOS transistor, a diode-connected second divider pMOS transistor connected to the first divider pMOS transistor, a first dividing resistor connected to the second divider pMOS transistor and a second dividing resistor connected between the first dividing resistor and the second power supply. The detecting circuit includes a detecting pMOS transistor whose gate electrode is connected to a connection node between the first dividing resistor and the second dividing resistor, a source resistor connected between the first power supply and the source electrode of the detecting pMOS transistor, and a drain resistor connected to the drain electrode of the detecting pMOS transistor and the second power supply.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous specific details are set fourth such as specific signal values, etc. to provide a thorough understanding of the present invention. However, it will be obvious to those skilled in the art that the present invention may be practiced without such specific details.

First Embodiment

As shown in FIG. 1, a power-on detection circuit according to the first embodiment of the present invention includes a voltage divider connected between a first power supply $V_{dd}$ and a second power supply $V_{ss}$, the potential $V_{ss}$ of the second power supply is lower than the potential $V_{dd}$ of the first power supply. The voltage divider is implemented by a diode $D_1$, a first dividing resistor $R_1$ and a second dividing resistor $R_2$ connected in series.

The power-on detection circuit further includes a detecting circuit between the first power supply $V_{dd}$ and the second power supply $V_{ss}$. The detecting circuit is implemented by a series connection of a pMOS transistor $Q_1$ whose gate electrode is connected to a connection node between the first dividing resistor $R_1$ and the second dividing resistor $R_2$; a source resistor $R_3$ connected between the first power supply $V_{dd}$ and the source electrode of the pMOS transistor $Q_1$; and a drain resistor $R_4$ connected to the drain electrode of the pMOS transistor $Q_1$ and the second power supply $V_{ss}$. An inverter INV is connected to a connection node between the drain electrode of the pMOS transistor $Q_1$ implementing the detecting circuit and the drain resistor $R_4$. Then, a potential of the connection node between the drain electrode of the pMOS transistor $Q_1$ and the drain resistor $R_4$ is transferred through the inverter INV.

The circuit portion surrounded with a box of dashed line in FIG. 1 corresponds to the conventional circuit explained in the beginning of the present Specification. As compared with the conventional circuit, according to the power-on detection circuit of the first embodiment, the diode $D_1$ is further inserted between the first power supply $V_{dd}$ and the series circuit of the first dividing resistor $R_1$ and the second dividing resistor $R_2$. That is, an anode side (p-side) of the diode $D_1$ is connected to the first power supply $V_{dd}$ and the series circuit of the first dividing resistor $R_1$ and the second dividing resistor $R_2$ inserted between a cathode side (n-side) of the diode $D_1$ and the second power supply $V_{ss}$.

Figure 2:
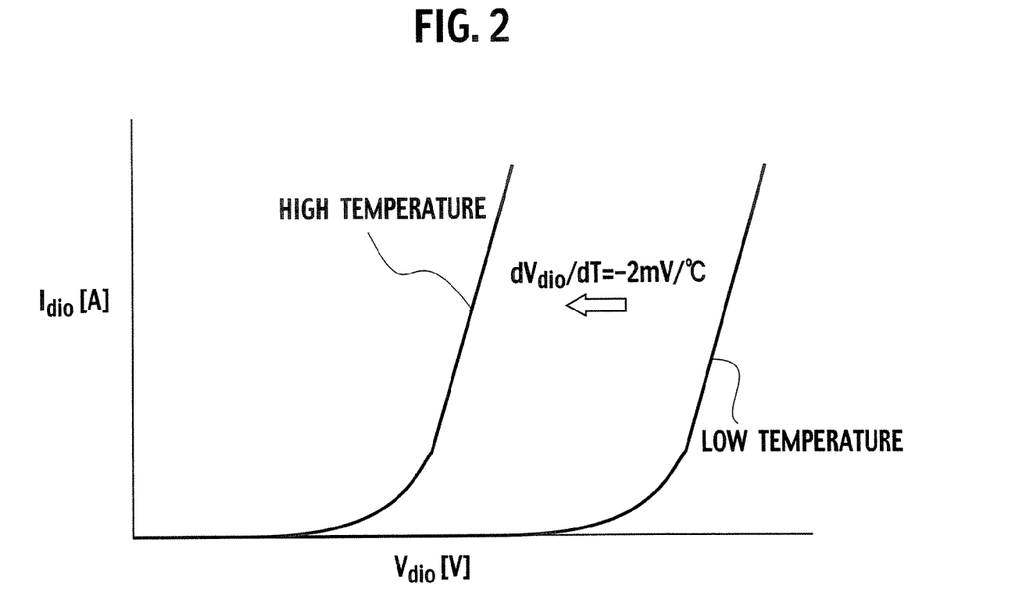
FIG. 2 is a graph showing a temperature dependence of a current voltage characteristic of a diode used in the power-on detection circuit of the first embodiment of the present invention, whereas the ordinate and the abscissa are shown on linear scales.
Figure 3:
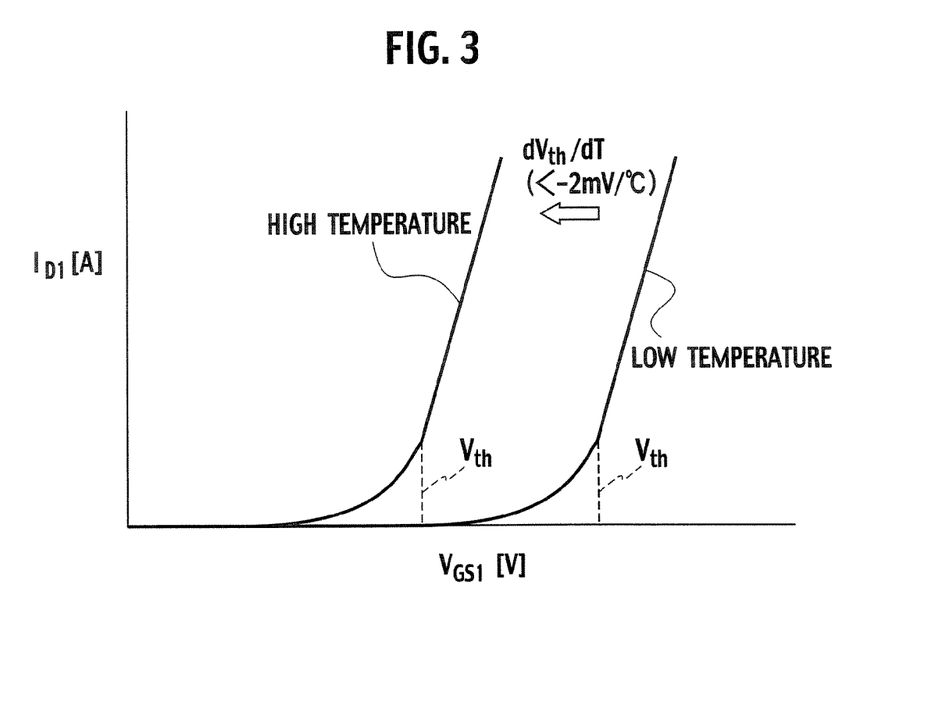
FIG. 3 is a graph showing a temperature dependence of current voltage characteristics and threshold voltages of transistors used in the power-on detection circuits according to the first embodiment of the present invention, whereas the ordinate and the abscissa are shown on linear scales.

An on-state voltage that is a potential difference established across the anode (p-side) and the cathode (n-side) when the diode $D_1$ is in a conductive (on) state is referred to as $V_{dio}$. As shown in FIG. 2, the on-state voltage $V_{dio}$ is known to have a temperature dependence $dV_{dio}/dT$ of about $-2$ mV/° C. On the other hand, a threshold voltage $V_{th}$ of the pMOS transistor $Q_1$ has a temperature dependence $dV_{th}/dT$, which is usually smaller in absolute value than the temperature dependence $dV_{dio}/dT$ of the diode $D_1$, as shown in FIG. 3. In FIGS. 2 and 3, both the ordinate and the abscissa are shown on linear scales.

Thus, as shown in FIG. 1, in the circuit configuration that the diode $D_1$, the first dividing resistor $R_1$ and the second dividing resistor $R_2$ are connected in series, with resistance values of the first dividing resistor $R_1$ and the second dividing resistor $R_2$ determined by Eq. (1), a potential $V_{G1}$ determined by the voltage division across the first dividing resistor $R_1$ and the second dividing resistor $R_2$ can have a temperature dependence equal to the temperature dependence of the threshold voltage $V_{th}$ of the pMOS transistor $Q_1$:

$$R_2/(R_1+R_2) = (dV_{th}/dT \times R_4/(R_3+R_4))/(-2 \times 10^{-3}(V/° C.)). \qquad (1)$$

In the first embodiment, an attention should be paid to the necessity that a source resistor $R_3$ is connected to the source electrode side of the pMOS transistor $Q_1$ so that a source potential $V_{s1}$ of the pMOS transistor $Q_1$ is decreased from the potential $V_{dd}$ of the first power supply. This is, because the on-state voltage $V_{dio}$ of the diode $D_1$ is typically considered to be higher than the absolute value of the threshold voltage $V_{th}$ of the pMOS transistor $Q_1$. A gate potential $V_{G1}$ of the pMOS transistor $Q_1$ is calculated from Eq. (2):

$$V_{G1} = (V_{dd} - V_{dio}) \times R_2/(R_1+R_2). \qquad (2)$$

Also, the source potential $V_{s1}$ of the pMOS transistor $Q_1$ is determined by Eq. (3):

$$V_{s1} - V_{G1} = V_{th} \qquad (3)$$

From the above explanation, the resistance values of the first dividing resistor $R_1$, the second dividing resistor $R_2$, the source resistor $R_3$ and the drain resistor $R_4$ shall be set so as to satisfy Eqs. (1), (2) and (3) simultaneously. If these resistance values cannot be managed precisely to be coincident with the resistance values determined by Eqs. (1), (2) and (3) simultaneously, it is preferable that the resistance values of the first dividing resistor $R_1$, the second dividing resistor $R_2$, the source resistor $R_3$ and the drain resistor $R_4$ are set so as to approximately satisfy Eq. (1) within the range of the requirement, after they has been set to satisfy Eqs. (2) and (3).

According to the power-on detection circuit of the first embodiment, even if the temperature is varied, the power-on potential can be kept so as not to vary. According to the power-on detection circuit of the first embodiment, the power-on potential can be detected at a constant potential, independently of the variation of temperature.

Second Embodiment

Figure 4:
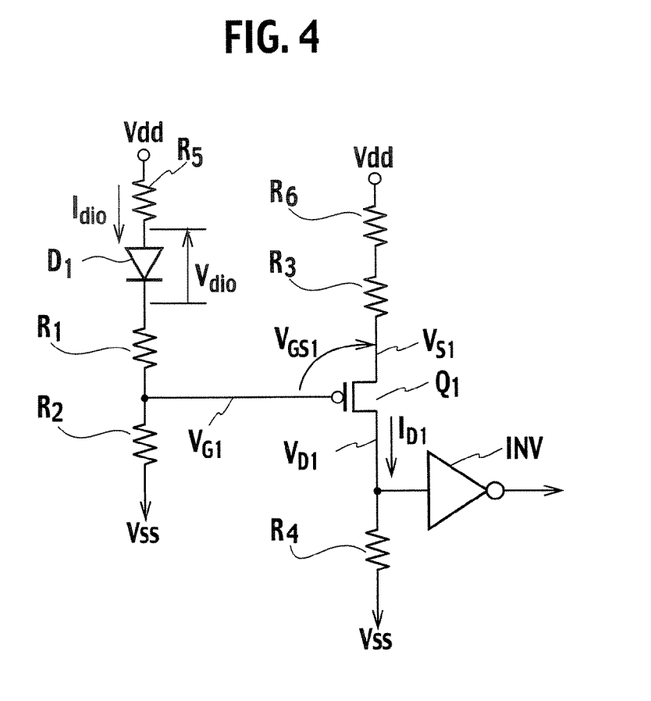
FIG. 4 is a circuit diagram of a power-on detection circuit according to a second embodiment of the present invention.

FIG. 4 shows a power-on detection circuit according to a second embodiment of the present invention. The power-on detection circuit according to the second embodiment corresponds to a modification of the power-on detection circuit explained in the first embodiment. The difference from the power-on detection circuit explained in the first embodiment lies in the circuit configuration that a divider series resistor $R_5$ is further connected between the first power supply $V_{dd}$ and the diode $D_1$, and a second source resistor $R_6$ is further connected between the first power supply $V_{dd}$ and the source resistor (first source resistor) $R_3$.

According to the power-on detection circuit of the second embodiment, even for the case that the power-on potential is considered to be excessively low for the circuit configuration shown in the first embodiment, the desirable power-on supply voltage can be obtained, because an increase of the potential is achieved by the voltage drop across the divider series resistor $R_5$ and the second source resistor $R_6$.

According to the power-on detection circuit of the second embodiment, similarly to the power-on detection circuit according to the first embodiment, the power-on potential can be detected at a constant potential, independently of the variation of temperature.

Third Embodiment

Figure 5:
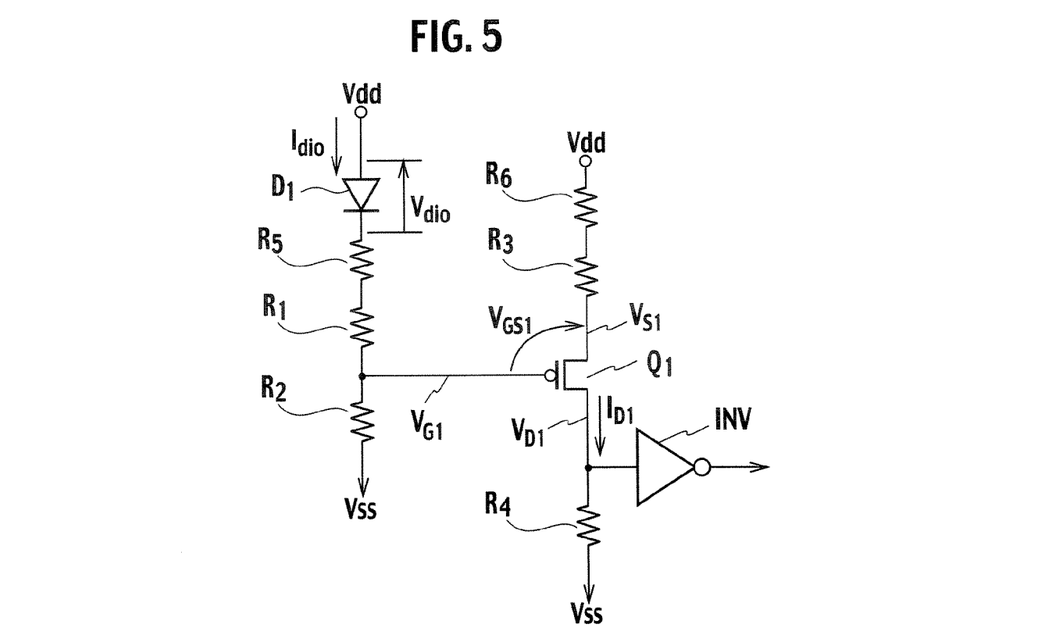
FIG. 5 is a circuit diagram of a power-on detection circuit according to a third embodiment of the present invention.

FIG. 5 shows a power-on detection circuit according to a third embodiment of the present invention. The power-on detection circuit according to the third embodiment corresponds to a modification of the power-on detection circuit explained in the second embodiment. The difference from the power-on detection circuit explained in the second embodiment lies in a circuit configuration that the inserted position of the divider series resistor $R_5$ is different.

According to the power-on detection circuit of the third embodiment, similarly to the second embodiment, even in the case that the power-on potential is estimated to be excessively low, the desirable power-on supply voltage can be obtained, because an increase of the potential is achieved by the voltage drop across the divider series resistor $R_5$ and the second source resistor $R_6$.

When the resistance values of the first dividing resistor $R_1$, the second dividing resistor $R_2$ and the divider series resistor $R_5$ are managed to satisfy Eq. (4), the potential $V_{G1}$ determined by the voltage division across the first dividing resistor $R_1$, the second dividing resistor $R_2$ and the divider series resistor $R_5$ can have the temperature dependence equal to the threshold voltage $V_{th}$ of the pMOS transistor $Q_1$.

$$R_2/(R_1+R_2+R_5)=(dV_{th}/dT \times R_4/(R_3+R_6+R_4))/(-2 \times 10^{-3} \text{ (V/}^\circ\text{ C.)}) \quad (4)$$

According to the power-on detection circuit of the third embodiment, the source resistor (first source resistor) $R_3$ and the second source resistor $R_6$ are inserted into the source electrode side of the pMOS transistor $Q_1$, and the source potential $V_{s1}$ of the pMOS transistor $Q_1$ is decreased from the potential $V_{dd}$ of the first power supply. The gate potential $V_{G1}$ of the pMOS transistor $Q_1$ is calculated from Eq. (5).

$$V_{G1}=(V_{dd}-V_{dio}) \times R_2/(R_1+R_2+R_5) \quad (5)$$

Also, the source potential $V_{s1}$ of the pMOS transistor $Q_1$ is represented by Eq. (6).

$$V_{s1}-V_{G1}=V_{th} \quad (6)$$

From the above explanation, the resistance values of the first dividing resistor $R_1$, the second dividing resistor $R_2$, the source resistor $R_3$, the drain resistor $R_4$ and the divider series resistor $R_5$ shall be set so as to satisfy Eqs. (4), (5) and (6) simultaneously. If these the resistance values cannot be managed to precisely coincident with the resistance values determined by Eqs. (4), (5) and (6) simultaneously, it is preferable that the resistance values of the first dividing resistor $R_1$, the second dividing resistor $R_2$, the source resistor $R_3$, the drain resistor $R_4$ and the divider series resistor $R_5$ are set so as to approximately satisfy Eq. (4) within the range of the requirement, after they have made to satisfy Eqs. (5) and (6).

According to the power-on detection circuit of the third embodiment, even if the temperature is varied, the power-on potential can be kept so as not to vary, and the desirable power-on supply voltage can be obtained because an increase of the potential is achieved by the voltage drop across the divider series resistor $R_5$ and the second source resistor $R_6$. According to the power-on detection circuit of the third embodiment, the power-on potential can be detected at a constant potential, independently of the variation of temperature.

Fourth Embodiment

Figure 6:
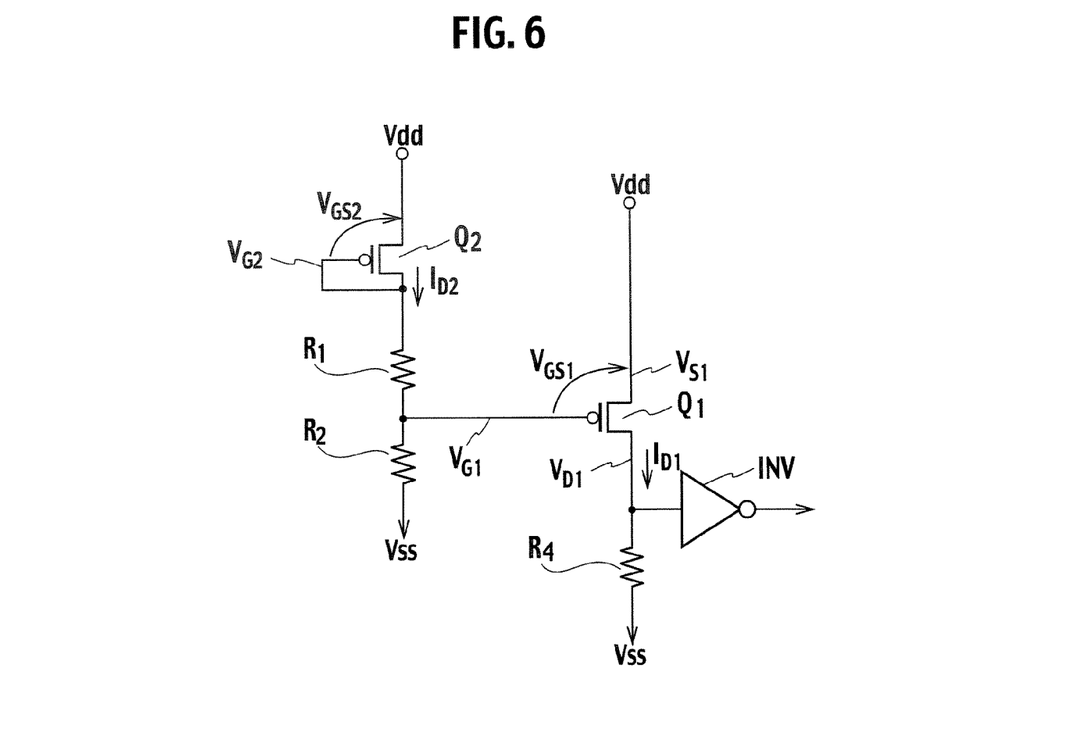
FIG. 6 is a circuit diagram of a power-on detection circuit according to a fourth embodiment of the present invention.

FIG. 6 shows a power-on detection circuit according to a fourth embodiment of the present invention. The power-on detection circuit according to the fourth embodiment is another modification of the power-on detection circuit explained in the first embodiment. In the power-on detection circuit of the first embodiment, the circuit configuration has been explained for detecting a constant power-on potential independently of the variation of temperature even if the threshold voltage $V_{th}$ of the pMOS transistor $Q_1$ has the temperature dependence, by establishing the voltage divider with the diode $D_1$ inserted between the first power supply $V_{dd}$ and the series circuit, which is implemented by the first dividing resistor $R_1$ and the second dividing resistor $R_2$. However, if the threshold voltage $V_{th}$ itself of the pMOS transistor $Q_1$ has the variation, the variation will cause a problem that the shift of the threshold voltage $V_{th}$ affects the value of the power-on potential. A subject of the power-on detection circuit according to the fourth embodiment is to relax such a problem.

The power-on detection circuit according to the fourth embodiment of the present invention differs from the power-on detection circuit already explained in the first embodiment in that the voltage divider encompasses a series circuit connected between the first power supply $V_{dd}$ and the second power supply $V_{ss}$, the potential $V_{ss}$ of the second power supply is lower than the potential $V_{dd}$ of the first power supply, the series circuit is implemented by a diode-connected "divider pMOS transistor (first pMOS transistor)" $Q_2$, a first dividing resistor $R_1$ and a second dividing resistor $R_2$.

Also, the circuit configuration of the detecting circuit is similar to the power-on detection circuit according to the first embodiment, until the structure that this has a second pMOS transistor (hereinafter may be called "the detecting pMOS transistor") $Q_1$ in which the potential $V_{G1}$ of the connection node between the first dividing resistor $R_1$ and the second dividing resistor $R_2$ is applied to a gate electrode, and the drain electrode of the detecting pMOS transistor $Q_1$ is connected through the drain resistor $R_4$ to the second power supply $V_{ss}$. However, the topology that the source electrode of the detecting pMOS transistor $Q_1$ is directly connected to the first power supply $V_{dd}$ differs from the power-on detection circuit already explained in the first embodiment (in the power-on detection circuit of the first embodiment shown in FIG. 1, the source resistor $R_3$ was connected between the first power supply $V_{dd}$ and the source electrode of the pMOS transistor $Q_1$).

The circuit configuration that the inverter INV is connected to the connection node between the drain electrode of the pMOS transistor $Q_1$ implementing the detecting circuit and the drain resistor $R_4$, and that the potential of the connection node between the drain electrode of the pMOS transistor $Q_1$ and the drain resistor $R_4$ is transferred through the inverter INV is similar to the power-on detection circuit already explained in the first embodiment.

Figure 7:
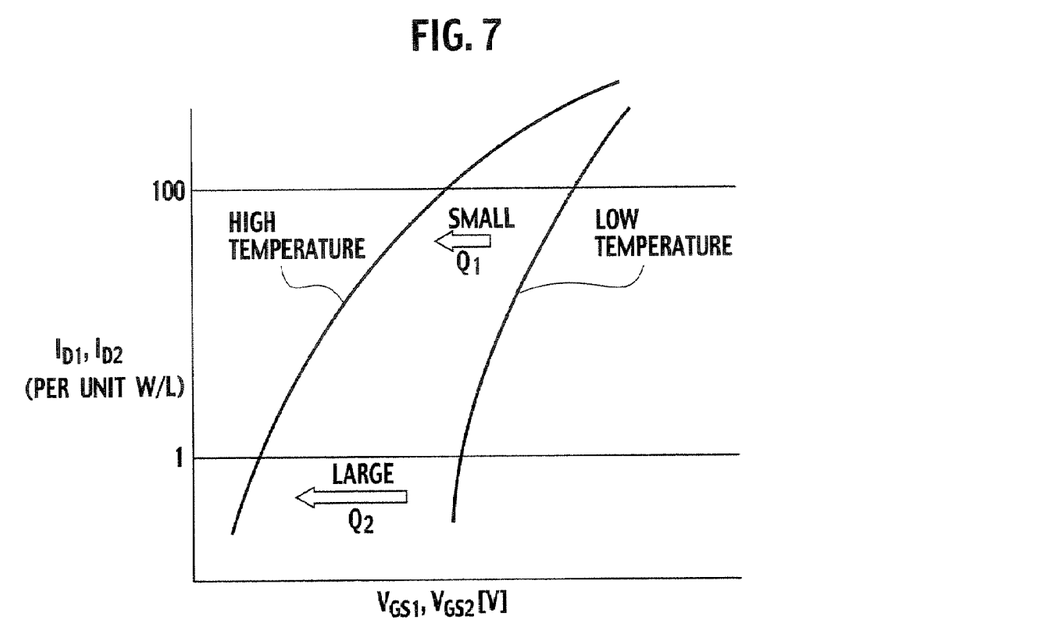
FIG. 7 is a graph showing a temperature dependence of gate electrode-voltage vs. drain-current characteristics of the detecting pMOS transistor $Q_1$ and the divider pMOS transistor $Q_2$ shown in FIG. 6, with gate width W and gate length L, the ordinate shows on a logarithmic scale the drain current $I_{D1}$ per unit W/L flowing through the detecting pMOS transistor $Q_1$ and the drain currents $I_{D2}$ per unit W/L flowing through the divider pMOS transistor $Q_2$, the abscissa shows on a linear scale the gate-source voltage $V_{GS1}$ of the detecting pMOS transistor $Q_1$ and the gate-source voltage $V_{GS2}$ of the divider pMOS transistor $Q_2$.

With gate width W and gate length L, FIG. 7 indicates the drain current $I_{D1}$ per unit W/L flowing through the detecting pMOS transistor $Q_1$ and the drain currents $I_{D2}$ per unit W/L flowing through the divider pMOS transistor $Q_2$ as the ordinate on a logarithmic scale, and the gate-source voltage $V_{GS1}$ of the detecting pMOS transistor $Q_1$ and the gate-source voltage $V_{GS2}$ of the divider pMOS transistor $Q_2$ as the abscissa on a linear scale. For example, the drain currents $I_{D2}$ per unit W/L may set to be smaller than the drain currents $I_{D1}$ per unit W/L, such that the gate width W of the divider pMOS transistor $Q_2$ shall be set to be 100 times the gate width W of the detecting pMOS transistor $Q_1$, while the flowing drain currents $I_{D1}$, $I_{D2}$ are kept to be the substantially same values. If so, a temperature dependence $dV_{GS2}/dT$ of a gate-source voltage $V_{GS2}$ of the divider pMOS transistor $Q_2$ can be made larger than a temperature dependence $dV_{GS1}/dT$ of a gate-source voltage $V_{GS1}$ of the detecting pMOS transistor $Q_1$.

Figure 8:
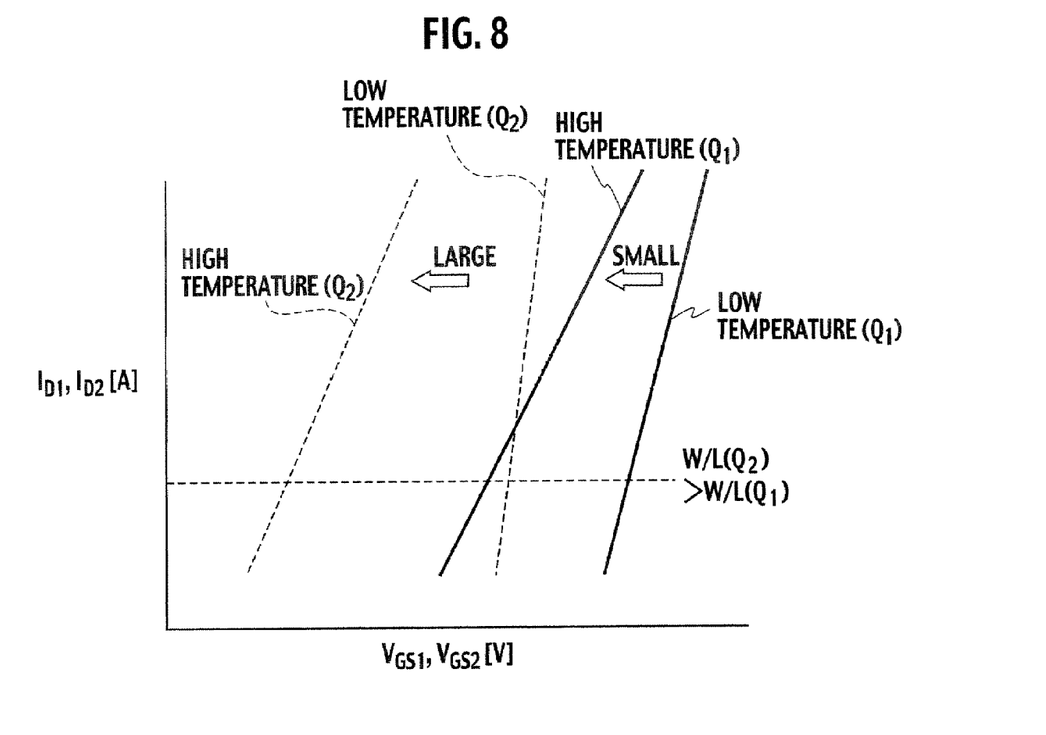
FIG. 8 is a graph showing a temperature dependence of gate electrode-source voltage vs. source-drain current characteristics of pMOS transistors $Q_1$ and $Q_2$, the ordinate shows on a logarithmic scale the drain currents $I_{D1}$ and $I_{D2}$, the abscissa shows on a linear scale the gate-source voltages $V_{GS1}$ and $V_{GS2}$.

FIG. 8 indicates the drain current $I_{D1}$ and $I_{D2}$ as the ordinate on a logarithmic scale, and the gate-source voltage $V_{GS1}$ and $V_{GS2}$ as the abscissa on a linear scale. As shown in FIG. 8, in the case that the ratio W/L of the divider pMOS transistor $Q_2$ is larger than the W/L of the detecting pMOS transistor $Q_1$, even if the flowing drain currents $I_{D1}$, $I_{D2}$ have the same values, the $dV_{GS2}/dT$ can be made larger than the $dV_{GS1}/dT$. That is, the drain currents $I_{D1}$, $I_{D2}$ per unit W/L shall be set such that the value of the divider pMOS transistor $Q_2$ is smaller than the value of the detecting pMOS transistor $Q_1$.

In the circuit configuration shown in FIG. 6, as can be understood from FIG. 7, there is a relationship of Eq. (7) between the gate-source voltage $V_{GS2}$ of the divider pMOS transistor $Q_2$ and the gate-source voltage $V_{GS1}$ of the detecting pMOS transistor $Q_1$.

$$V_{dd} - \{V_{dd} - |V_{GS2}|\} \times R_2/(R_1+R_2) = |V_{GS1}| \quad (7)$$

Also, when the temperature dependence of the gate-source voltage $V_{GS2}$ of the divider pMOS transistor $Q_2$ is represented by $dV_{GS2}/dT$ and the temperature dependence of the gate-source voltage $V_{GS1}$ of the detecting pMOS transistor $Q_1$ is represented by $dV_{GS1}/dT$, there is a relationship of Eq. (8) as can be understood from FIG. 8.

$$|dV_{GS2}/dT| > |dV_{GS1}/dT| \quad (8)$$

Thus, with $V_{s1} = V_{dd}$ in Eq (6), the potential $V_{dd}$ of the first power supply in a period of power-on stage and the resistance values of the first dividing resistor $R_1$ and the second dividing resistor $R_2$ are determined so as to satisfy Eq (9).

$$|dV_{GS2}/dT| \times R_2/(R_1+R_2) = |dV_{GS1}/dT| \quad (9)$$

Also, the absolute values of the first dividing resistor $R_1$ and the second dividing resistor $R_2$ are determined by the requirement for the current $I_{D2}$ flowing through the series connected resistors, which implement the voltage divider.

Also, different from the first to third embodiments, instead of the diode $D_1$, the diode-connected divider pMOS transistor $Q_2$, having a gate length L equal to the gate length L of the detecting pMOS transistor $Q_1$, is replaced in the voltage divider. Thus, if the detecting pMOS transistor $Q_1$ and the divider pMOS transistor $Q_2$ are integrated on the same semiconductor chip, the threshold voltage variation of the divider pMOS transistor $Q_2$ can be assumed to vary similarly with the threshold voltage variation of the detecting pMOS transistor $Q_1$.

That is, according to the power-on detection circuit of the fourth embodiment, since the gate lengths L of the divider pMOS transistor $Q_2$ and the detecting pMOS transistor $Q_1$ are set to be equal, both of the threshold voltages $V_{th}$ are considered to scatter with a value $\Delta V_{th}$, which is equal to each other. In short, since the threshold voltage $V_{th}$ of the divider pMOS transistor $Q_2$ scatters with $\Delta V_{th}$, the gate-source voltage $V_{GS1}$ of the detecting pMOS transistor $Q_1$ scatters with $\Delta V_{GS1}$ shown in Eq. (10).

$$\Delta V_{GS1} = \Delta V_{th} \times R_2/(R_1+R_2) \quad (10)$$

That is, even if the threshold voltage $V_{th}$ of the detecting pMOS transistor $Q_1$ scatters with $\Delta V_{th}$, the amount of the variation of gate-source voltage $V_{GS1}$ of the detecting pMOS transistor $Q_1$ is reduced to a value corresponding to the value of $\Delta V_{GS1}$, which is prescribed in Eq. (10). Hence, although not perfect, it is possible to remove the temperature dependence and relax the influence caused by the threshold voltage variation.

According to the power-on detection circuit of the fourth embodiment, in addition to the effect of the variation in characteristics caused by temperature, the effect of the variation of threshold voltage itself of the detecting pMOS transistor $Q_1$ can be minimized so as to relax the variation in the power-on potential.

Fifth Embodiment

Figure 9:
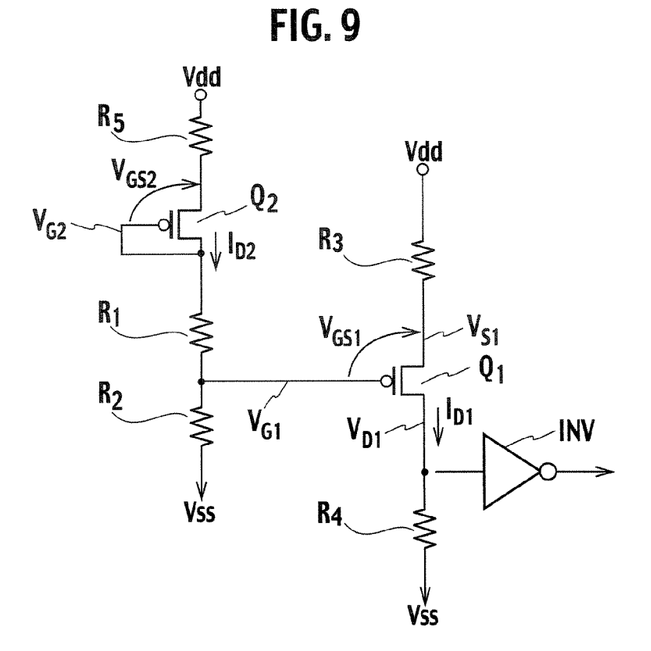
FIG. 9 is a circuit diagram of a power-on detection circuit according to a fifth embodiment of the present invention.

FIG. 9 shows a power-on detection circuit according to a fifth embodiment of the present invention. In the fourth embodiment, the potential $V_{dd}$ of the first power supply in a period of power-on stage and the resistance values of the first dividing resistor $R_1$ and the second dividing resistor $R_2$ are determined so as to satisfy Eqs. (6) and (9) with $V_{s1} = V_{dd}$. Thus, in a situation such that the potential $V_{dd}$ of the first power supply in a period of power-on stage is controlled to have no temperature dependence, it was impossible to freely adjust the potential $V_{dd}$ of the first power supply in a period of power-on stage.

The purpose of the power-on detection circuit according to the fifth embodiment is to freely set the potential $V_{dd}$ of the first power supply in a period of power-on stage, while forcing the potential $V_{dd}$ of the first power supply in a period of power-on stage to have no temperature dependence.

For this reason, the power-on detection circuit according to the fifth embodiment differs from the power-on detection circuit already explained in the fourth embodiment in that the divider series resistor $R_5$ is further inserted between the first power supply $V_{dd}$ and the divider pMOS transistor $Q_2$, and the source resistor $R_3$ is further inserted between the first power supply $V_{dd}$ and the source electrode of the detecting pMOS transistor $Q_1$.

Even in a case that the power-on potential is estimated to be excessively low for the power-on detection circuit according to the fourth embodiment, the desirable power-on supply voltage can be obtained in the fifth embodiment, because an increase of the potential is achieved by the voltage drop across the divider series resistor $R_5$ and the second source resistor $R_6$.

According to the power-on detection circuit of the fifth embodiment, in addition to the effect of the variation in characteristics caused by temperature, the effect of the variation of threshold voltage itself of the detecting pMOS transistor $Q_1$ can be minimized so as to relax the variation in the power-on potential.

Sixth Embodiment

Figure 10:
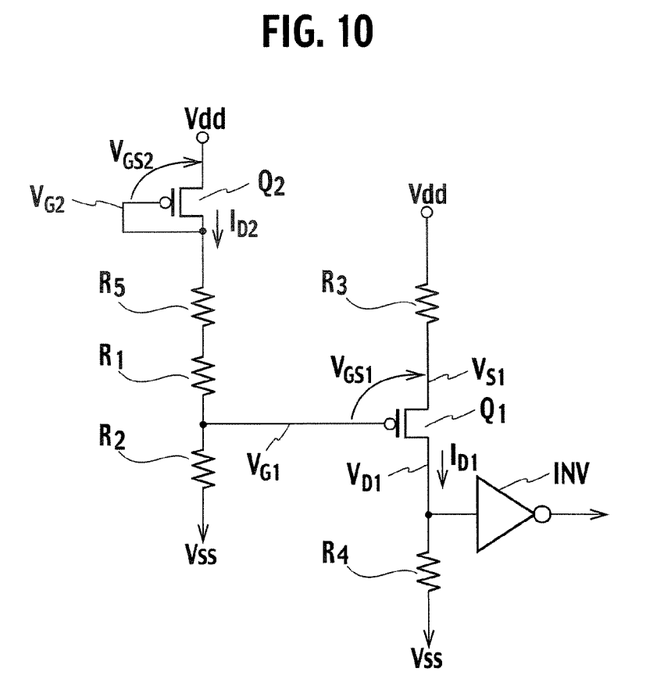
FIG. 10 is a circuit diagram of a power-on detection circuit according to a sixth embodiment of the present invention.

FIG. 10 shows a power-on detection circuit according to a sixth embodiment of the present invention. The power-on detection circuit according to the sixth embodiment corresponds to a modification of the power-on detection circuit explained in the fifth embodiment. The difference from the power-on detection circuit explained in the fifth embodiment lies in the location where the divider series resistor $R_5$ is inserted in a circuit configuration.

According to the power-on detection circuit of the sixth embodiment, similarly to the fifth embodiment, even in the case that the power-on potential is estimated to be excessively low for the fourth embodiment, the desirable power-on supply voltage can be obtained, because an increase of the potential is achieved by the voltage drop across the divider series resistor $R_5$ and the source resistor $R_3$.

When the resistance values of the first dividing resistor $R_1$, the second dividing resistor $R_2$ and the divider series resistor $R_5$ are managed to satisfy Eq. (11), the potential $V_{G1}$ determined by the voltage division across the first dividing resistor $R_1$, the second dividing resistor $R_2$ and the divider series resistor $R_5$ can have the temperature dependence equal to the temperature dependence $dV_{th(Q1)}/dT$ of the threshold voltage $V_{th(Q1)}$ of the detecting pMOS transistor $Q_1$.

$$R_2/(R_1+R_2+R_5)=(dV_{th(Q1)}/dT \times R_4/(R_6+R_4))/(dV_{th(Q2)}/dT) \quad (11)$$

Also, according to the power-on detection circuit of the sixth embodiment, it is necessary to insert the source resistor $R_3$ into the source electrode side of the detecting pMOS transistor $Q_1$ and decrease the source potential $V_{s1}$ of the detecting pMOS transistor $Q_1$ from the first power supply $V_{dd}$. The gate potential $V_{G1}$ of the detecting pMOS transistor $Q_1$ is calculated from Eq. (12).

$$V_{G1}=(V_{dd}-V_{dio}) \times R_2/(R_1+R_2+R_5) \quad (12)$$

Also, the source potential $V_{s1}$ is represented by Eq. (13).

$$V_{s1}-V_{G1}=V_{th(Q1)} \quad (13)$$

From the above explanation, the resistance values of the first dividing resistor $R_1$, the second dividing resistor $R_2$, the source resistor $R_3$, the drain resistor $R_4$ and the divider series resistor $R_5$ shall be set so as to satisfy Eqs. (11), (12) and (13) simultaneously. If these resistance values cannot be managed to precisely coincident with the resistance values defined by Eqs. (11), (12) and (13) simultaneously, it is preferable that the resistance values of the first dividing resistor $R_1$, the second dividing resistor $R_2$, the source resistor $R_3$, the drain resistor $R_4$ and the divider series resistor $R_5$ are set so as to approximately satisfy Eq. (11) within the range of the requirement, after they have made to satisfy Eqs. (12) and (13).

Thus, the resistance values of the drain resistor $R_4$ and the source resistor $R_3$ are determined such that the source potential $V_{s1}$ of the detecting pMOS transistor $Q_1$ has the value represented by Eq. (13). According to the power-on detection circuit of the sixth embodiment, even if the temperature is varied, the power-on potential can be kept so as not to vary. Also, according to the power-on detection circuit of the sixth embodiment, in addition to the effect of the variation in characteristics caused by temperature, the effect of the variation of threshold voltage itself of the detecting pMOS transistor $Q_1$ can be minimized so as to relax the variation in the power-on potential.

Seventh Embodiment

Figure 11:
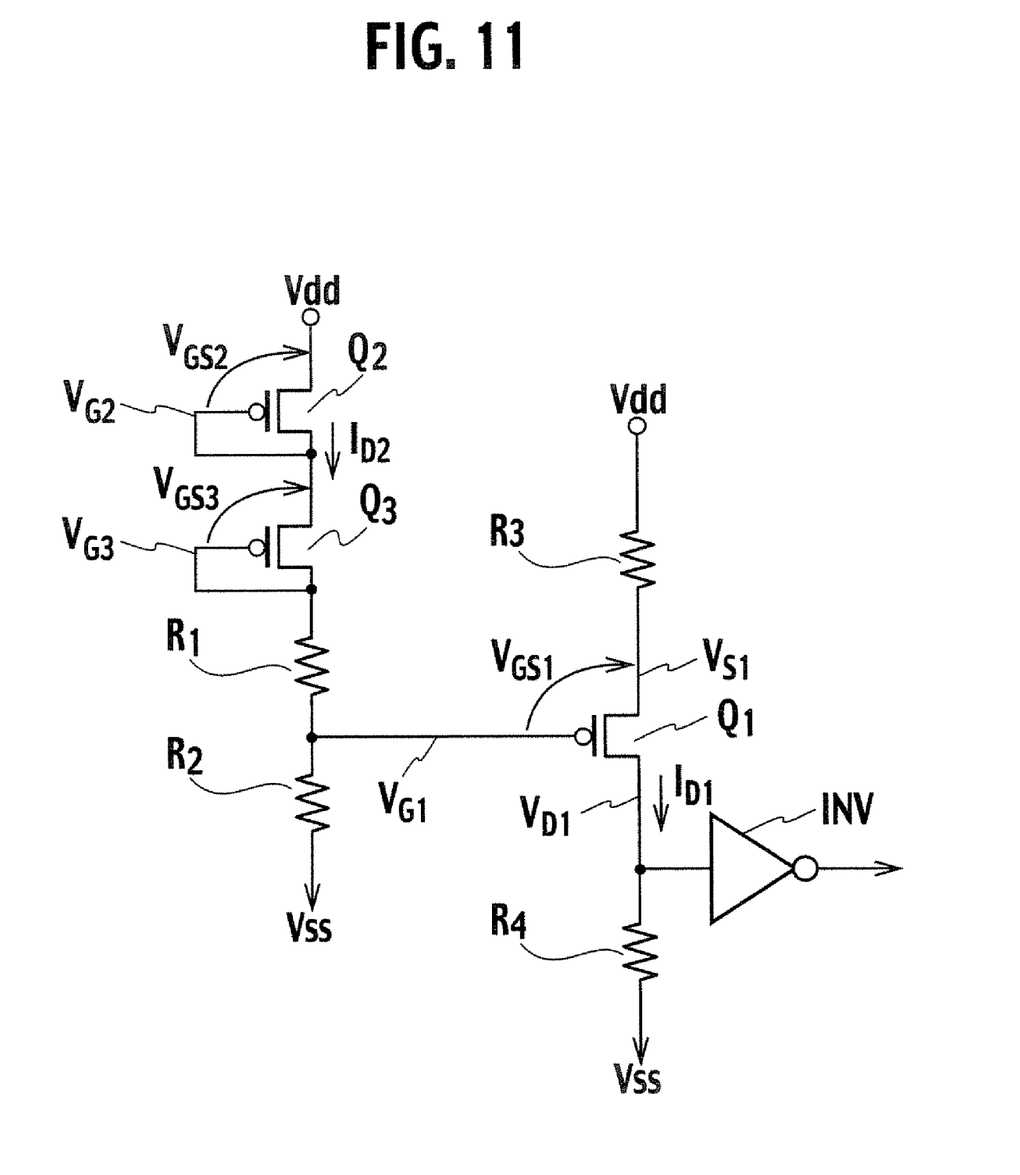
FIG. 11 is a circuit diagram of a power-on detection circuit according to a seventh embodiment of the present invention.

FIG. 11 shows a power-on detection circuit according to a seventh embodiment of the present invention. In the fourth embodiment, the gate width W of the divider pMOS transistor $Q_2$ has been set to be 100 times the gate width W of the detecting pMOS transistor $Q_1$, the flowing currents $I_{D1}$, $I_{D2}$ were set to the same values, so that the temperature dependence of the power-on potential can be minimized, and that the threshold voltage variation dependence ca be reduced. The power-on detection circuit according to the seventh embodiment corresponds to a modification of the power-on detection circuit explained in the fourth embodiment.

The power-on detection circuit according to the seventh embodiment is directed to a scheme for minimizing simultaneously both the temperature dependent variation of the power-on potential and the dependence on the variation of threshold voltages, with a circuit configuration including a detecting pMOS transistor $Q_1$, a first divider pMOS transistor $Q_2$ and a second divider pMOS transistor $Q_3$, all of the pMOS transistors $Q_1$, $Q_2$ and $Q_3$ having the same ratio (W/L), which is defined as the ratio of the gate width W against to the gate length L.

As shown in FIG. 11, the power-on detection circuit according to the seventh embodiment of the present invention includes a voltage divider connected between a first power supply $V_{dd}$ and a second power supply $V_{ss}$, which provide lower potential $V_{ss}$ than the potential $V_{dd}$ of the first power supply. A first divider pMOS transistor $Q_2$, a second divider pMOS transistor $Q_3$, a first dividing resistor $R_1$ and a second dividing resistor $R_2$ are connected in series so as to implement the voltage divider. The first divider pMOS transistor $Q_2$ and the second divider pMOS transistor $Q_3$ are respectively diode-connected and are equal in the ratio W/L, or the ratio of the gate width W against to the gate length L. The first dividing resistor $R_1$ and the second dividing resistor $R_2$ are equal in resistance value.

On the other hand, the detecting circuit is implemented by a series connection of a detecting pMOS transistor $Q_1$ whose gate electrode is connected to the connection node between the first dividing resistor $R_1$ and the second dividing resistor $R_2$; a source resistor $R_3$ connected between the first power supply $V_{dd}$ and a source electrode of the detecting pMOS transistor $Q_1$; and a drain resistor $R_4$ connected between a drain electrode of the detecting pMOS transistor $Q_1$ and the second power supply $V_{ss}$. Here, the detecting pMOS transistor $Q_1$ and the first divider pMOS transistor $Q_3$ are equal in the ratio W/L of the gate width W to the gate length L.

The power-on detection circuit according to the seventh embodiment of the present invention is required to satisfy Eq.

(14), with the potential $V_{dd}$ of the first power supply, the gate-source voltage $V_{GS2}$ of the first divider pMOS transistor $Q_2$, the gate-source voltage $V_{GS3}$ of the second divider pMOS transistor $Q_3$, and the gate-source voltage $V_{GS1}$ of the detecting pMOS transistor $Q_1$.

$$V_{dd}-\{V_{dd}-|V_{GS2}|-|V_{GS3}|\}\times R_2/(R_1+R_2)=|V_{GS1}| \quad (14)$$

$$V_{dd}-\{V_{dd}-|V_{GS2}|-|V_{GS3}|\}/2=|V_{GS1}| \quad (15)$$

Here, as shown in Eq. (15), if we assume that the resistance values of the first dividing resistor $R_1$ and the second dividing resistor $R_2$ are equal, because the temperature dependences of the threshold voltages $V_{th}$ of the detecting pMOS transistor $Q_1$, the first divider pMOS transistor $Q_2$ and the second divider pMOS transistor $Q_3$ are approximately equal, the temperature dependence of the potential $V_{G1}$ of the detecting pMOS transistor $Q_1$ becomes substantially equal to the temperature dependence of the threshold voltage $V_{th}$ of the detecting pMOS transistor $Q_1$. Hence, if the resistance values of the source resistor $R_3$ and the drain resistor $R_4$ are determined so as to satisfy Eq. (15), it is possible to design the power-on detection circuit, which does not depend on the temperature and the threshold voltage variation of the detecting pMOS transistor.

According to the power-on detection circuit of the seventh embodiment, in addition to the effect of the variation in characteristics caused by temperature, the effect of the variation of threshold voltage itself of the detecting pMOS transistor $Q_1$ can be minimized so as to relax the variation in the power-on potential.

Other Embodiments

Various modifications will become possible for those skilled in the art after receiving the teaching of the present disclosure without departing from the scope thereof. The technical scope of the present invention shall not be limited to the power on detection circuits disclosed in the first to seventh embodiments, because the circuit configurations and the related explanations disclosed in the first to seventh embodiments are mere examples so that any person skilled in the art can carry out the present invention.

Various modification of the present invention can be enabled without departing from the technical ideas and features disclosed in the first to seventh embodiments. In other words, the changes, the improvements or the replacement of one of the constituent elements may be possible within a scope of the present invention. Thus, the present invention of course includes various embodiments and modifications and the like which are not detailed above. Therefore, the scope of the present invention will be defined in the following claims.

What is claimed is:

1. A circuit for detecting a power-on voltage of a power supply, comprising:
   a voltage divider connected between a first power supply and a second power supply, the potential of the second power supply is lower than the potential of the first power supply, the voltage divider including a series circuit which includes:
   a diode;
   a first dividing resistor connected to the diode; and
   a second dividing resistor connected between the first dividing resistor and the second power supply; and
   a detecting circuit connected between the first power supply and the second power supply, the detecting circuit including:
   a pMOS transistor whose gate electrode is connected to a connection node between the first dividing resistor and the second dividing resistor;
   a source resistor connected between the first power supply and the source electrode of the pMOS transistor; and
   a drain resistor connected to the drain electrode of the pMOS transistor and the second power supply,
   wherein a resistance value $R_1$ of the first dividing resistor, a resistance value $R_2$ of the second dividing resistor, a resistance value $R_3$ of the source resistor $R_3$ and a resistance value $R_4$ of the drain resistor satisfy:

$$R_2/(R_1+R_2)=(dV_{th}/dT \times R_4/(R_3+R_4))/(dV_{dio}/dT),$$

where $dV_{th}/dT$ is a temperature dependence of a threshold voltage of the pMOS transistor, and $dV_{dio}/dT$ is a temperature dependence of an on-state voltage of the diode.

2. The circuit of claim 1, further comprising a divider series resistor connected between the first power supply and the diode.

3. The circuit of claim 2, further comprising a second source resistor connected between the first power supply and the source resistor.

4. The circuit of claim 1, further comprising a divider series resistor connected between the diode and the first dividing resistor.

5. The circuit of claim 4, further comprising a second source resistor connected between the first power supply and the source resistor.

6. A circuit for detecting a power-on voltage of a power supply, comprising:
   a voltage divider connected between a first power supply and a second power supply, the potential of the second power supply is lower than the potential of the first power supply, the voltage divider including a series circuit which includes:
   a diode-connected first pMOS transistor;
   a first dividing resistor connected to the first pMOS transistor; and
   a second dividing resistor connected between the first dividing resistor and the second power supply; and
   a detecting circuit connected between the first power supply and the second power supply, the detecting circuit including:
   a second pMOS transistor whose gate electrode is connected to a connection node between the first dividing resistor and the second dividing resistor; and
   a drain resistor connected to the drain electrode of the second pMOS transistor and the second power supply,
   wherein a resistance value $R_1$ of the first dividing resistor and a resistance value $R_2$ of the second dividing resistor satisfy:

$$|dV_{GS1}/dT| \times R_2/(R_1+R_2)=|dV_{GS2}/dT|$$

where $dV_{GS1}/dT$ is a temperature dependence of gate-source voltage of the first pMOS transistor, and $dV_{GS2}/dT$ is a temperature dependence of gate-source voltage of the second pMOS transistor.

7. The circuit of claim 6, further comprising a divider series resistor connected between the first power supply and the first pMOS transistor.

8. The circuit of claim 7, further comprising a source resistor connected between the first power supply and the source electrode of the second pMOS transistor.

9. The circuit of claim 6, further comprising a divider series resistor connected between the first pMOS transistor and the first dividing resistor.

10. The circuit of claim 9, further comprising a source resistor connected between the first power supply and the source electrode of the second pMOS transistor.

11. A circuit for detecting a power-on voltage of power supply, comprising:
- a voltage divider connected between a first power supply and a second power supply, the potential of the second power supply is lower than the potential of the first power supply, the voltage divider including a series circuit comprising:
  - a diode-connected first divider pMOS transistor;
  - a diode-connected second divider pMOS transistor connected to the first divider pMOS transistor;
  - a first dividing resistor connected to the second divider pMOS transistor; and
  - a second dividing resistor connected between the first dividing resistor and the second power supply; and
- a detecting circuit connected between the first power supply and the second power supply, the detecting circuit including:
  - a detecting pMOS transistor whose gate electrode is connected to a connection node between the first dividing resistor and the second dividing resistor;
  - a source resistor connected between the first power supply and the source electrode of the detecting pMOS transistor; and
  - a drain resistor connected to the drain electrode of the detecting pMOS transistor and the second power supply
- wherein, with gate width W and gate length L, ratios W/L in the first and second divider pMOS transistors are equal,
- wherein resistance values of the first and second dividing resistors are equal.

12. A circuit for detecting a power-on voltage of a power supply, comprising:
- a voltage divider connected between a first power supply and a second power supply, the potential of the second power supply is lower than the potential of the first power supply, the voltage divider including a series circuit comprising:
  - a diode-connected first divider pMOS transistor;
  - a diode-connected second divider pMOS transistor connected to the first divider pMOS transistor;
  - a first dividing resistor connected to the second divider pMOS transistor; and
  - a second dividing resistor connected between the first dividing resistor and the second power supply; and
- a detecting circuit connected between the first power supply and the second power supply, the detecting circuit including:
  - a detecting pMOS transistor whose gate electrode is connected to a connection node between the first dividing resistor and the second dividing resistor;
  - a source resistor connected between the first power supply and the source electrode of the detecting pMOS transistor; and
  - a drain resistor connected to the drain electrode of the detecting pMOS transistor and the second power supply,
- wherein a relationship given by:

$$Vdd-\{Vdd-|V_{GS1}|-|V_{GS2}|\}/2=|V_{GS3}|$$

is satisfied, where Vdd is a potential supplied by the first power supply, $V_{GS1}$ is a gate-source voltage of the first divider pMOS transistor, $V_{GS2}$ is a gate-source voltage of the second divider pMOS transistor and $V_{GS3}$ is a gate-source voltage of the detecting pMOS transistor.

* * * * *